US012747491B2

(12) United States Patent
Biethan et al.

(10) Patent No.: US 12,747,491 B2
(45) Date of Patent: Sep. 29, 2026

(54) TUBULAR SPUTTER CATHODE

(71) Applicant: Bühler Alzenau GmbH, Alzenau (DE)

(72) Inventors: Jens-Peter Biethan, Hégenheim (FR); Martin Stapp, Dreiech (DE); Harro Hagedorn, Frankfurt (DE)

(73) Assignee: Bühler Alzenau GmbH, Alzenau (DE)

(*) Notice: Subject to any disclaimer, the term of this patent is extended or adjusted under 35 U.S.C. 154(b) by 0 days.

(21) Appl. No.: 18/860,094

(22) PCT Filed: Apr. 27, 2023

(86) PCT No.: PCT/EP2023/061099
§ 371 (c)(1),
(2) Date: Oct. 25, 2024

(87) PCT Pub. No.: WO2023/209083
PCT Pub. Date: Nov. 2, 2023

(65) Prior Publication Data

US 2025/0346990 A1 Nov. 13, 2025

(30) Foreign Application Priority Data

Apr. 27, 2022 (EP) .................................... 22170184

(51) Int. Cl.
*C23C 14/34* (2006.01)
*C23C 14/04* (2006.01)
(Continued)

(52) U.S. Cl.
CPC ........ *C23C 14/3407* (2013.01); *C23C 14/042* (2013.01); *C23C 14/35* (2013.01);
(Continued)

(58) Field of Classification Search
CPC .............. C23C 14/3407; C23C 14/042; C23C 14/35; C23C 14/547; H01J 37/3405; H01J 37/3455
See application file for complete search history.

(56) References Cited

U.S. PATENT DOCUMENTS

2004/0026240 A1* 2/2004 Shidoji ................ C23C 14/505
204/298.03
2017/0029940 A1 2/2017 Van de Putte et al.
(Continued)

FOREIGN PATENT DOCUMENTS

| | | | |
|---|---|---|---|
| CN | 103074587 | B | 10/2014 |
| JP | 2017511429 | A | 4/2017 |
| WO | 2017198297 | A1 | 11/2017 |

OTHER PUBLICATIONS

Vergöhl et al., "Progress on optical coatings deposited with dual rotatable magnetrons in a sputter up system", Surface & Coatings Technology, 2014, pp. 38-44, vol. 241, Elsevier.

*Primary Examiner* — Patrick S Ott
(74) *Attorney, Agent, or Firm* — The Webb Law Firm

(57) ABSTRACT

A magnetron sputtering system including a substrate to be coated and a magnetron sputtering device including at least one rotatable tubular cathode, a mask positioned between the cathode and the substrate and at least one magnet. The magnet is tiltably supported inside the tubular cathode. The system further includes a controller, wherein the controller is configured to control a tilt of the at least one magnet and/or a tilt of the at least one rotatable tubular cathode with respect to the substrate to be coated for tuning coating uniformity on the substrate.

17 Claims, 4 Drawing Sheets

(51) Int. Cl.
*C23C 14/35* (2006.01)
*C23C 14/54* (2006.01)
*H01J 37/34* (2006.01)

(52) U.S. Cl.
CPC ........ *C23C 14/547* (2013.01); *H01J 37/3405* (2013.01); *H01J 37/3455* (2013.01)

(56) References Cited

U.S. PATENT DOCUMENTS

| | | | | |
|---|---|---|---|---|
| 2019/0003039 | A1* | 1/2019 | Portka | C23C 14/3464 |
| 2020/0002806 | A1* | 1/2020 | Demura | G02B 1/113 |
| 2021/0164092 | A1* | 6/2021 | Vergöhl | H01J 37/32935 |

* cited by examiner

TUBULAR SPUTTER CATHODE

CROSS-REFERENCE TO RELATED APPLICATIONS

This application is the United States national phase of International Application No. PCT/EP2023/061099 filed Apr. 27, 2023, and claims priority to European Patent Application No. 22170184.0, filed Apr. 27, 2022, the disclosures of which are hereby incorporated by reference in their entireties.

BACKGROUND OF THE INVENTION

Field of the Invention

The present invention relates to a sputtering method, a tubular sputter cathode and a magnetron sputtering system.

Description of Related Art

Sputtering systems or devices, in particular magnetron sputtering devices, are used in order to manufacture high quality and high precision layers and layer systems in a reproduceable manner. A key factor for increasing the useable surface/area of the end product is the deposited layer's thickness distribution over the whole substrate surface to be coated. For optimisation thereof, mechanical masks (also referred to as "shapers") are used. The properties of the mask, such as the shape and geometry of the mask, are calculated in advance based on a layer thickness distribution obtained by measurement, and the resulting mask is mounted between target and substrate. Thereby, a precise layer distribution on the substrate surface to be coated can be obtained after several iterations. However, the mask is not able to maintain the uniformity over the entire target lifetime. Moreover, the effect of the mask on the uniformity of the deposited layer is highly dependent on the materials and the process settings used. Even a small change of those can significantly degrade the uniformity.

However, since the target geometry changes over the course of its life cycle, a difference in layer distribution may occur which cannot be compensated by the methods used so far. This effect is in general less relevant when using tubular cathodes as opposed to planar cathodes since the generation of a "race track" can largely be avoided due to the rotation of the target cathode. However, there may still be deviations from the previously calculated optimal layer distribution, e.g. by geometry changes at the boundary areas of the target. Moreover, when changing the target, i.e. using a new target of the same material, differences may occur due to structural deviations of the material (crystallography/domains) or geometrical variations within the mechanical tolerances of the target or mounting variations, respectively.

SUMMARY OF THE INVENTION

It is therefore an object of the present disclosure to provide a method, system and cathode obviating the above problems.

The invention is defined in the independent claims. Dependent claims describe preferred embodiments.

The present disclosure relates to a magnetron sputtering system comprising a substrate to be coated and a magnetron sputtering device comprising at least one rotatable tubular cathode, a mask positioned between the cathode and the substrate and at least one magnet, wherein the magnet is tiltably supported inside the tubular cathode. The system further comprises a controller, wherein the controller is configured to control a tilt of the at least one magnet and/or a tilt of the at least one rotatable tubular cathode with respect to the substrate to be coated for tuning coating uniformity on the substrate.

Various embodiments may preferably implement the following features.

The sputtering system may further comprise a measuring means configured to measure a layer thickness distribution on the substrate. The controller may be configured to control tilt of the at least one magnet based on the measured layer thickness distribution.

The mask may be asymmetrical or symmetrical.

The magnet may be tiltable by +/−180°, preferably by +/−45°, more preferably by +/−20°, and more preferably +/−15°.

The rotatable tubular cathode may comprise a rotational axis. The magnet may be tiltable around the rotational axis or an axis parallel to said rotational axis. Preferably, the magnet is mechanically and/or electrically tiltable.

The measuring means may be configured to measure the layer thickness distribution in-situ or ex-situ.

The measuring means may be configured to measure the layer thickness distribution by spectrometry or ellipsometry.

The system may comprise a plurality of rotatable tubular cathodes. The cathodes may be identically constructed.

The sputtering system may be configured to iteratively perform measurement of the layer thickness distribution and controlling the tilt of the magnet.

The measuring means may be included in the magnetron sputtering device.

The controller may be included in the magnetron sputtering device.

The present disclosure further relates to a method for controlling a layer thickness distribution on a substrate to be coated in a magnetron sputtering system, preferably as described above, the magnetron sputtering system comprising at least one rotatable tubular cathode, a substrate to be coated, a mask positioned between the cathode and the substrate, and at least one magnet, wherein the magnet is tiltably supported inside the tubular cathode.

The method comprises controlling a tilt of the magnet and/or a tilt of the cathode with respect to the substrate to be coated to tune coating uniformity on the substrate to be coated.

Various embodiments may preferably implement the following features.

The method may further comprise measuring a layer thickness distribution of the substrate to be coated. Measuring the layer thickness and controlling the tilt may be iteratively performed.

The measuring may be performed in-situ or ex-situ.

The measuring may be performed by spectrometry or ellipsometry.

The present disclosure further relates to the use of a system or a method as described herein for compensating a layer thickness on a substrate to be coated due to bowing or bending of the substrate to be coated.

BRIEF DESCRIPTION OF THE DRAWINGS

The Invention is Further Described with Reference to the Following FIGURES. Therein, FIGS. 1*a*) to 1*c*) show sectional views of tubular cathodes according to an example of the present disclosure having magnets tilted at different angles, FIG. 2*a*) shows a sectional view of tubular cathodes according to an example of the present disclosure mounted below a mask, FIG. 2*b*) shows a mask according to an example of the present disclosure in a plan view.

DESCRIPTION OF THE INVENTION

In the following, layer thickness distribution may refer to a homogenous thickness distribution or an inhomogeneous thickness distribution such as a thickness gradient. The disclosure encompasses sputtering devices having a single cathode or a plurality of cathodes, e.g. pair(s) of cathodes.

A controller as described herein may e.g. be a processor, computer, smartphone or the like.

Generally, a magnetron sputtering system or device comprises an anode, at least one cathode 1 serving as a target, a substrate or surface to be coated and a mask 3 which is positioned between the cathode 1 and the substrate or surface to be coated. According to the present invention, at least one cathode is provided as rotatable tubular cathode. Inside the tubular cathode 1, a magnet 2 is provided. The magnet 2 is tiltably provided inside the cathode 1 as will be further described below. The magnetron sputtering device may particularly be a turntable sputtering device. The mask 3 is provided to ensure a uniform coating of the substrate. According to the use and wear of the cathode 1 (target), the uniformity of the coating may not be ensured over the entire lifetime of the mask and the target. According to an embodiment, several, such as two electrodes may be provided as rotatable tubular electrodes that can both act as cathode. That is, in this case, one of the electrodes acts as cathode, i.e. target, while the other electrode acts as anode. Depending on the process settings, the cathode 1 serving as a target may change during operation of the magnetron.

Figure 1A:
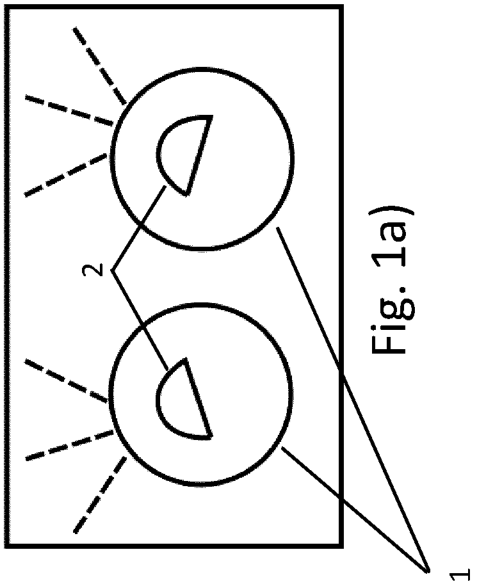
Figure 1B:
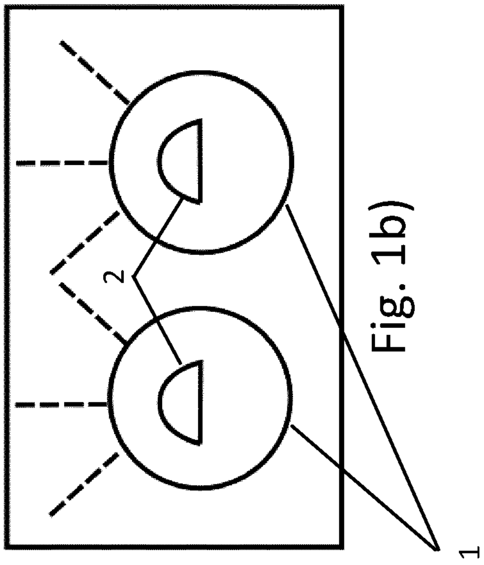
Figure 1C:
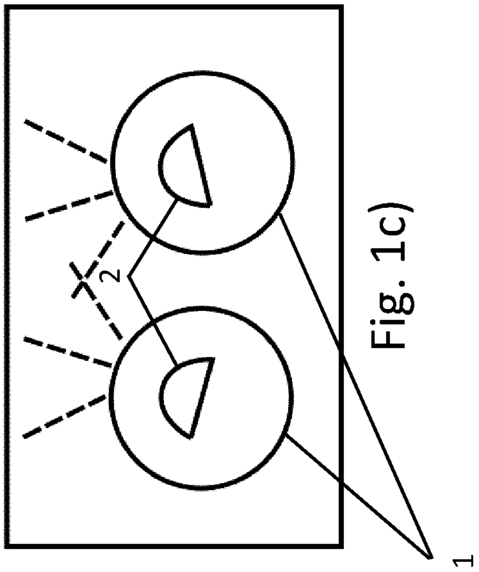

FIGS. 1*a*) to 1*c*) show (rotatable) tubular cathodes 1 according to an example of the present disclosure. In particular, the figures show a sectional view, wherein the section is made perpendicular to a rotational axis (not shown) of each of the tubular cathodes 1. In FIGS. 1*a*) to 1*c*), pairs of cathodes 1 are shown for illustrative purposes only but the present invention is not limited thereto. The cathodes 1 may be oriented substantially parallel to the mask 3 and/or the substrate to be coated. Inside of each of the cathodes 1, a magnet 2 is provided. Each of the magnets 2 is rotatable or tiltable around the rotational axis of the cathode 1 or an axis parallel to the rotational axis of the cathode 1. The magnets may be full rotatable, i.e. tiltable by +/−180°. Preferably, the magnets 2 are tiltable by +/−45°, more preferably by +/−20°, and even more preferably by +/−15°. The tilt and the resulting magnetic field, that is the direction of the magnetic field, are exemplarily indicated by the dotted lines in FIGS. 1*a*) to 1*c*). Hence, in FIG. 1*a*), the magnets 2 are tilted outwardly, in FIG. 1*b*), the magnets 2 are aligned perpendicularly to the mask 3 (not shown, see FIG. 2*a*)) and in FIG. 1*c*), the magnets 2 are tilted inwardly. The magnets 2 may have a bar form or any other form suitable to be placed inside the cathode 1.

Figure 2A:
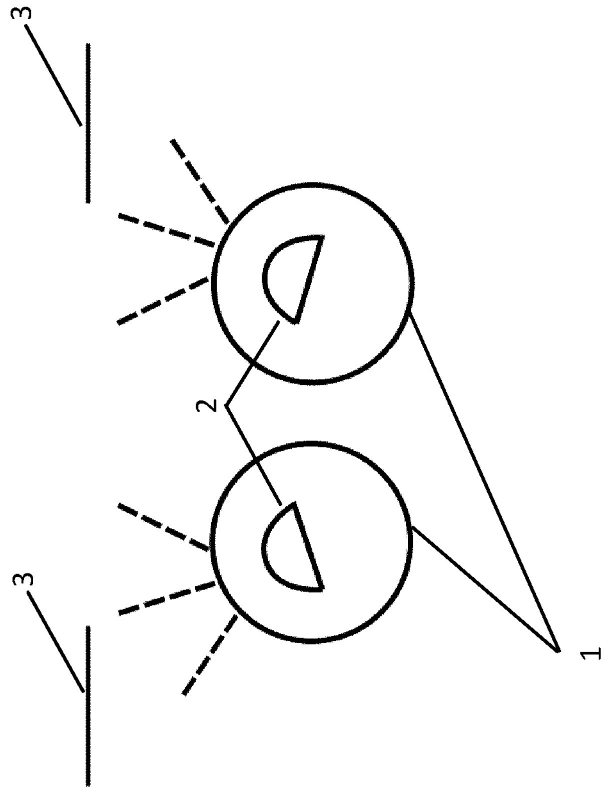

FIG. 2*a*) is a sectional view of a pair of cathodes 1 each having a magnet 2 inside and a mask 3 positioned between the cathodes 1, i.e. the targets, and a substrate to be coated (not shown). In FIG. 2*a*), the magnets 2 are each tilted outwardly. The direction of view is the same as in FIGS. 1*a*) to 1*c*), i.e. in the direction of the rotational axis.

Figure 2B:
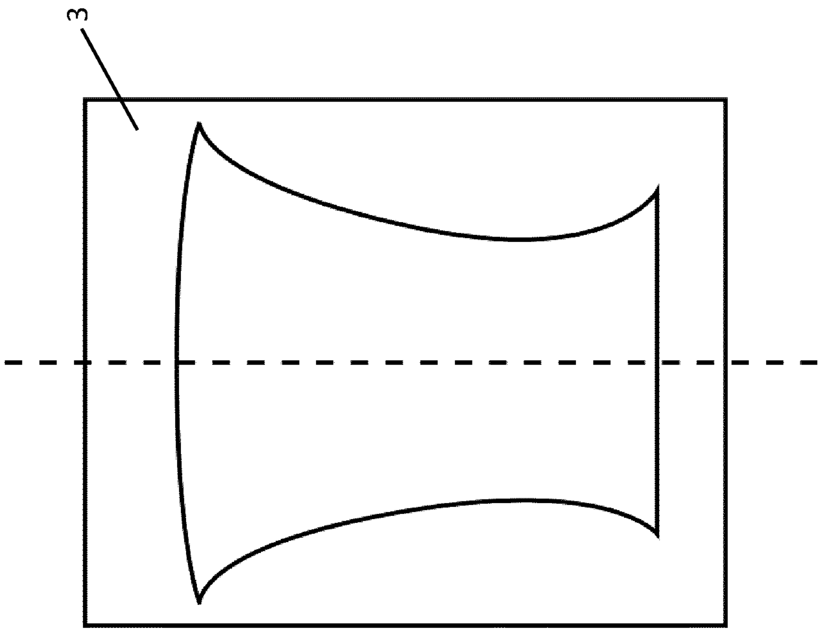

FIG. 2*b*) shows a plan view of an exemplary mask 3 with a shape that is symmetrical with respect to a central axis shown as a dotted line. The mask may be symmetrically provided with respect to the cathodes 1. The mask 3 may be provided symmetrically or asymmetrically in various shapes and formed from various materials according to the properties of the sputtering device, the target and/or the substrate to be coated. The properties may include the material of the target, the material of the substrate to be coated, etc.

By tilting the magnets 2, certain areas of the mask 3 are highlighted, i.e. hit by more coating material, while other areas are less hit by the coating. Thereby, a coating on the substrate as desired is ensured without the necessity to change the mask 3 or the target. As explained above, the desired coating may encompass uniform coating, gradient coating or inhomogeneous coating.

The sputtering system may further comprise a measuring means configured to measure a layer thickness distribution on the substrate. A measuring means may also be configured to measure relevant parameters of the cathode assembly (e.g. position, tilt, thickness, etc.). The measurement may be performed in-situ or ex-situ, e.g. by spectrometry or ellipsometry. That is, the measuring means may be provided inside the sputtering device but may also be externally provided and thus not form part of the sputtering device itself.

Moreover, a controller may be provided in the sputtering system or the sputtering device which is configured to control a tilt of the magnet(s) 2. Controlling of the tilt is performed to tune or control a uniformity of the coating on the substrate. Controlling of the tilt may also be performed according to the measured layer thickness distribution. The controller may be a computer, a microcontroller, a processor or the like. In this case, the magnets 2 are electrically tiltable. However, in addition or as an alternative, the magnets 2 may also be manually tiltable.

By controlling the tilt of the magnet(s) 2, a precise and high quality coating of the substrate may be ensured without the necessity to change the mask 3. Moreover, a uniform coating, a gradient coating or a coating impacting particular areas of the substrate can be achieved by the combination of a mask 3 and controlling the tilt of the magnets 2. Moreover, compensating a thickness distribution of the coating on the substrate due to bowing or bending of the substrate may be possible, thus providing a uniform coating layer. In other words, by tilting the magnetic field, a layer thickness distribution may be controlled according to the set angle.

Measuring of the layer thickness and tilting of the magnet(s) 2 may be alternately and/or iteratively performed until a desired thickness distribution, preferably close to an optimum distribution can be achieved.

Hence, the cathode 1, i.e. the target, as well as the mask 3 may be used for a longer period without interruption, replacement or modification without compromising the quality and uniformity of the coating. However, the mask 3 may still be additionally adapted if necessary.

Also, the sputtering device does not have to be ventilated or stopped since the adaptation of the magnet angle may be performed at any point in time previous to, during, or after the coating process.

The present invention may be employed for stationary or moving substrates. Moving substrates herein may also include a subrotation of the substrate, a planetary rotation of the substrate, a substrate positioned on a barrel, or similar. The sputtering device may comprise a single tubular cathode 1 (DC type), a pair of tubular cathodes 1 (MF type, RF type) or a plurality of tubular cathodes. If a plurality of cathodes 1 is employed, the functionality of the cathodes 1 may change, wherein depending on the setting, one of the cathodes 1 acts as a target. Which of cathode 1 acts as a target, however, may be changed during the process.

Moreover, also cathodes 1 having a small diameter may be equipped with a magnet 2 as described above.

Figure 3:
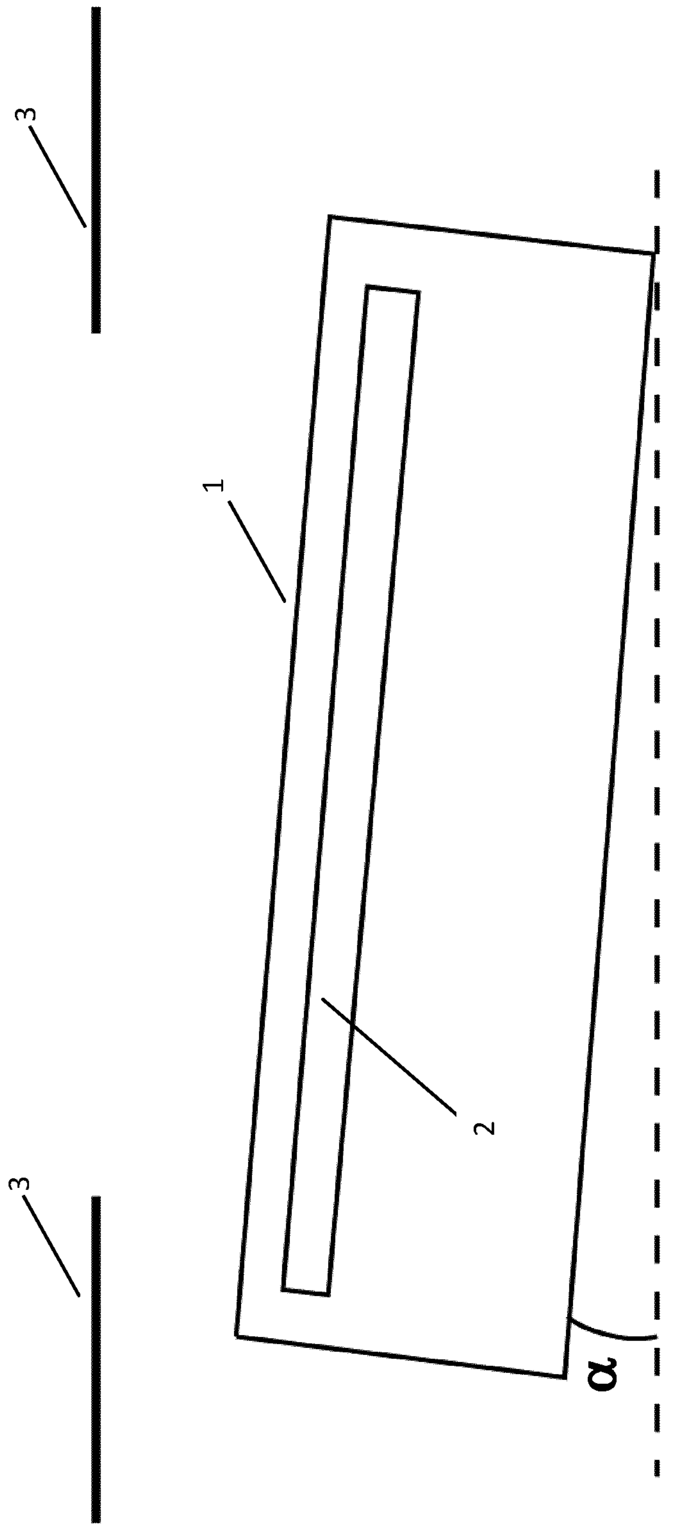
FIG. 3 shows a tilt of a tubular cathode according to an example of the present disclosure.

In addition, the tubular cathode 1 itself may be tilted with respect to the mask 3 or the substrate. This is shown in FIG. 3 which is a side view of the cathode 1, i.e. the direction of view is turned by 90° with respect to FIGS. 1 and 2*a*). Instead of, or in addition to, tilting the magnet 2, the cathode 1 together with the magnet 2 may be tilted. The tilt may be performed with respect to the substrate or the mask, i.e. with respect to a plane parallel to the substrate or the mask as indicated by the angle $\alpha$ in FIG. 3. Tilting may be performed on both sides of the cathode 1 and in positive and negative angle directions with respect to the plane mentioned above. The features of the example described with reference to FIGS. 1 and 2 are also applicable to the example of FIG. 3.

Also by this tilting, the uniformity of the coating may be controlled and corrected.

Figure 4:
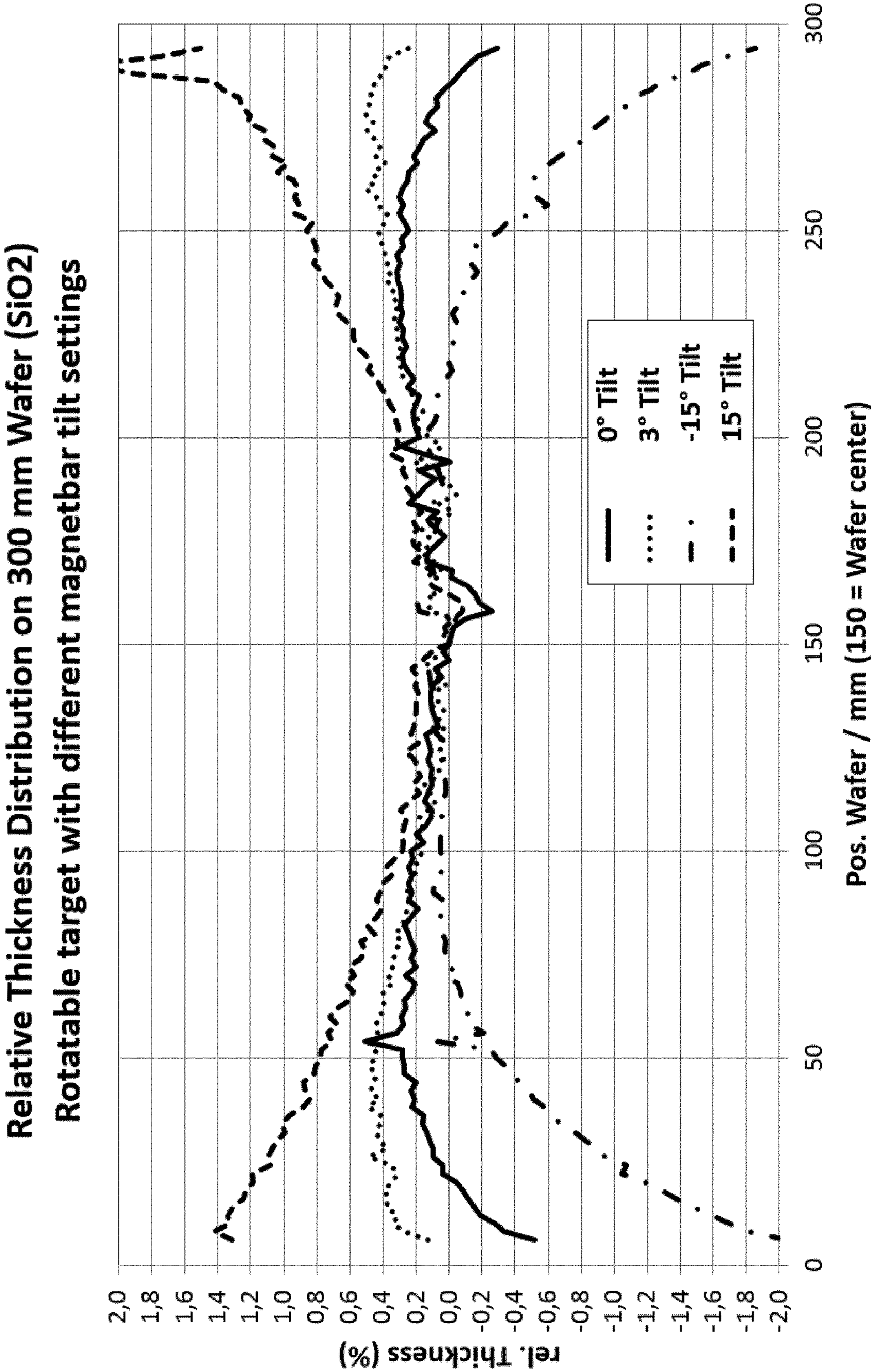
FIG. 4 shows a relative thickness coating distribution on a wafer depending on a tilt of a magnet bar.

FIG. 4 depicts a relative coating thickness distribution on a wafer dependent on a tilt of the magnet. The present example graphs relate to a Si wafer having a diameter of 300 mm which is coated with $SiO_2$ using a sputtering device as described above with reference to FIGS. 1 and 2, i.e. having a tiltable magnet (bar) 2 inside a rotatable tubular cathode 1 (target). The graph shows the relative thickness over the position on the wafer, wherein the 150 mm mark denotes the centre of the wafer.

As exemplary tilt angles, 0° (continuous line), +3° (dotted line), −15° (dotted/dashed line) and +15° (dashed line) were examined and are depicted in the graph. As evident from FIG. 4, the tilt angle of the magnet 2 noticeably affects the thickness distribution, particularly on the peripheral areas of the wafer (i.e. towards the 0 mm and the 300 mm mark on the x-axis). Thus, a thickness distribution and uniformity of the coating may effectively be controlled according to the present disclosure.

The results of FIG. 4 may equally be achieved by the example as described with reference to FIG. 3.

The present disclosure also relates to corresponding methods. The method is provided to control a layer thickness distribution on a substrate to be coated in a magnetron sputtering device, preferably as described above. The method comprises controlling a tilt of the magnet to tune coating uniformity of the substrate to be coated. The method in accordance with FIG. 3 comprises controlling a tilt of the at least one tubular cathode 1 to tune coating uniformity of the substrate to be coated. Measuring and controlling may be iteratively performed as described above. The desired thickness distribution may encompass uniform coating, gradient coating or any other form of inhomogeneous coating.

Moreover, the methods and systems described above may be used to correct or tune uniformity changes occurring due to the bending of the substrate as a result of the coating stress induced e.g. by layer strain, temperature or other mechanical impacts to the substrate (extrinsic or intrinsic). This may be of particular importance for multilayer runs on thin substrates, e.g. SiH filter with high intrinsic stress. In other words, the method and system described herein may be used for compensating variations in the layer thickness due to bowing or bending of the substrate, respectively. Moreover, the application of the method and system described herein may also encompass one or more of compensation of lifetime effects of the targets, compensation of variations due to structural/crystallographic differences of the targets, e.g. after target exchange, compensation of mechanical variations of the target and or mask, achieving different gradient coating with a limited set of masks or one mask only, and/or dynamic compensation of deposition rate differences due to mechanical stress on the substrate resulting in non-flat/bowed substrates. Bowing of the substrate may occur due to layer stress due to deposited coating, impact due to mechanical force (e.g. gravity), or temperature impact due to a mismatch between the individual thermal expansion coefficients. The present disclosure, however, is not limited to the above-mentioned applications which are given as examples only.

The present disclosure is particularly applicable to thin and delicate substrates. Thus, e.g. thin glass substrates having a thickness of about 1 mm or smaller, e.g. 0.1 mm, which tend to deformation (i.e. bowing/bending) during the coating process, may be uniformly coated with the method and system as presented herein.

Other aspects, features, and advantages will be apparent from the summary above, as well as from the description that follows, including the figures and the claims.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

Furthermore, in the claims the word "comprising" does not exclude other elements or steps, and the indefinite article "a" or "an" does not exclude a plurality. A single unit may fulfil the functions of several features recited in the claims. The terms "essentially", "about", "approximately" and the like in connection with an attribute or a value particularly also define exactly the attribute or exactly the value, respectively. Any reference signs in the claims should not be construed as limiting the scope.

The invention claimed is:

1. A magnetron sputtering system comprising:
- a substrate to be coated,
- a magnetron sputtering device comprising:
  - at least one rotatable tubular cathode,
  - a mask positioned between the at least one rotatable tubular cathode and the substrate, and
  - at least one magnet, wherein the at least one magnet is tiltably supported inside the at least one rotatable tubular cathode,
- a measuring means configured to iteratively perform measurement of a layer thickness distribution on the substrate, and
- a controller configured to control a tilt of the at least one magnet and a tilt of the at least one rotatable tubular cathode with respect to the substrate to be coated for tuning coating uniformity on the substrate to be coated based upon the measured layer thickness distribution.

2. The magnetron sputtering system according to claim 1, wherein the mask is asymmetrical or symmetrical.

3. The magnetron sputtering system according to claim 1, wherein the at least one magnet is tiltable by +/−180°.

4. The magnetron sputtering system according to claim 1, wherein the at least one rotatable tubular cathode comprises a rotational axis, and wherein the at least one magnet is tiltable around the rotational axis or an axis parallel to said rotational axis, and optionally the at least one magnet is mechanically and/or electrically tiltable.

5. The magnetron sputtering system according to claim 1, wherein the measuring means is configured to measure the layer thickness distribution in-situ or ex-situ, and optionally the measuring means is configured to measure the layer thickness distribution by spectrometry or ellipsometry.

6. The magnetron sputtering system according to claim 1, wherein the system comprises a plurality of the at least one rotatable tubular cathodes, and optionally the at least one rotatable tubular cathodes are identically constructed.

7. The magnetron sputtering system according to claim 1, wherein the measuring means is included in the magnetron sputtering device.

8. The magnetron sputtering system according to claim 1, wherein the controller is included in the magnetron sputtering device.

9. A system according to claim 1 for compensating for variations in a layer thickness on the substrate to be coated.

10. The magnetron sputtering system according to claim 1, wherein the at least one magnet is tiltable by +/−45°.

11. The magnetron sputtering system according to claim 1, wherein the at least one magnet is tiltable by +/−20°.

12. The magnetron sputtering system according to claim 1, wherein the at least one magnet is tiltable by +/−15°.

13. A magnetron sputtering system comprising:

a substrate to be coated, a magnetron sputtering device comprising:

at least one rotatable tubular cathode, a mask positioned between the at least one rotatable tubular cathode and the substrate, and at least one magnet, wherein the at least one magnet is tiltably supported inside the at least one rotatable tubular cathode, a measuring means configured to measure a layer thickness distribution on the substrate, and a controller configured to control a tilt of the at least one rotatable tubular cathode with respect to the substrate to be coated for tuning coating uniformity on the substrate to be coated based upon the measured layer thickness distribution.

14. A method for controlling a layer thickness distribution on a substrate to be coated in a magnetron sputtering system, the magnetron sputtering system comprising:

at least one rotatable tubular cathode, a substrate to be coated, a mask positioned between the at least one rotatable tubular cathode and the substrate, and at least one magnet, wherein the at least one magnet is tiltably supported inside the at least one rotatable tubular cathode;

the method comprising:

iteratively measuring a layer thickness distribution of the substrate to be coated, and controlling a tilt of the at least one magnet and a tilt of the at least one rotatable tubular cathode with respect to the substrate to be coated to tune coating uniformity on the substrate to be coated based upon the measured layer thickness distribution.

15. The method according to claim 14, wherein the measuring is performed in-situ or ex-situ.

16. The method according to claim 14, wherein the measuring is performed by spectrometry or ellipsometry.

17. A method according to claim 14 for compensating for variations in a layer thickness on the substrate to be coated.

* * * * *